United States Patent
Kwok

(10) Patent No.: US 6,805,614 B2
(45) Date of Patent: Oct. 19, 2004

(54) MULTILAYERED CMP STOP FOR FLAT PLANARIZATION

(75) Inventor: Siang Ping Kwok, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 192 days.

(21) Appl. No.: 09/997,882

(22) Filed: Nov. 30, 2001

(65) Prior Publication Data

US 2002/0065023 A1 May 30, 2002

Related U.S. Application Data

(60) Provisional application No. 60/250,211, filed on Nov. 30, 2000.

(51) Int. Cl.$^7$ ................................................. B24B 7/22
(52) U.S. Cl. .......................................... 451/37; 451/41
(58) Field of Search ............................. 451/37, 36, 41, 451/57; 438/424

(56) References Cited

U.S. PATENT DOCUMENTS

| | | | | |
|---|---|---|---|---|
| 5,930,645 A | * | 7/1999 | Lyons et al. | 438/424 |
| 6,001,706 A | * | 12/1999 | Tan et al. | 438/424 |
| 6,391,768 B1 | * | 5/2002 | Lee et al. | 438/633 |
| 6,410,403 B1 | * | 6/2002 | Wu | 438/424 |

* cited by examiner

*Primary Examiner*—Robert A. Rose
(74) *Attorney, Agent, or Firm*—Jacqueline J. Garner; W. James Brady III; Frederick J. Telecky, Jr.

(57) ABSTRACT

A three layer film (116/114/112), such as nitride/oxide/nitride for a CMP stop layer (110). A gap filling material (120) is polished, stopping on the first film (112). The first film (112) is then stripped using an etch chemistry that is selective against removing the second film (114). CMP is then continued stopping on the third film (116).

6 Claims, 4 Drawing Sheets

MULTILAYERED CMP STOP FOR FLAT PLANARIZATION

This application claims priority under 35 USC §119(e)(1) of provisional application No. 60/250,211 filed Nov. 30, 2000.

FIELD OF THE INVENTION

The invention is generally related to the field of chemical mechanical polishing (CMP) and more specifically to stopping layers for CMP.

BACKGROUND OF THE INVENTION

Chemical-mechanical polishing (CMP) for planarizing semiconductor wafers during fabrication is becoming more and more common. Two key areas in which CMP planarization is critical are shallow trench isolation (STI) and interconnect layers. A CMP system generally consists of a polishing pad, wafer carrier, and slurry. As a wafer carrier positions a semiconductor wafer against the polishing pad, slurry is added between the polishing pad and the wafer. The wafer, the pad, or, more typically, both are moved to planarize the surface of the wafer. CMP employs both a mechanical removal of material (due to the physical abrasion of the polishing pad and slurry particles against the surface of the wafer) and a chemical removal (etch) of material (due to the chemical components of the slurry).

The planarization uniformity for many integrated circuits is difficult to control across the entire die or wafer. This is mainly due to the topography of the wafer. Process irregularities such as pad conditioning, down force, and slurry delivery may also be a factor. Although CMP can be a timed polish, for many applications CMP uses a stop layer to determine the CMP endpoint. One such application is shallow trench isolation (STI).

STI is being widely used for isolation in large-scale integrated circuits (ICs) to isolate the active areas of transistors and other devices from each other. STI is formed prior to transistor formation. Referring to FIG. 1A, a pad oxide 12 and pad nitride 14 are deposited over the surface of the semiconductor 10. The pad oxide 12 and nitride 14 are then patterned and etched to form a hard mask for the trench etch. Shallow trenches 16 are then etched into the semiconductor surface 10. A trench liner (not shown) may be deposited on the surface of the trench 16 and the trench is filled with a dielectric material 20, such as high density plasma (HDP) silicon dioxide. This is followed by CMP using the pad nitride 14 as a polish stop. As shown in FIG. 1B, various oxide step heights remain across the wafer. The delta in oxide 20 height may be on the order of 100–200 nm. The oxide step heights become more pronounced when the pad nitride 14 and pad oxide 12 are later removed.

Significant dishing and non-planarity results after CMP depending on the range of pattern densities on the chip. Despite the addition of dummy moats (active areas), the oxide step height differences over the active areas can range as high as 100–200 nm. This is most significant when a large capacitor, such as those used in test chips, are included. Such non-planarity presents formidable problems for linewidth control and overetch budgets in subsequent process steps. Reverse pattern etch-back and separate CMP monitor wafers (to monitor process parameters such as GOI-gate oxide integrity) are used to reduce non-planarity arising from a large range of pattern densities at the expense of increasing manufacturing cost. High selective CMP slurries do not eliminate dishing due to pattern density difference.

SUMMARY OF THE INVENTION

The invention comprises at least a three layer film, such as nitride/oxide/nitride for a CMP stop layer. A gap filling material is polished, stopping on the first film. The first film is then stripped using an etch chemistry that is selective against removing the second film. CMP is then continued stopping on the third film.

An advantage of the invention is method of providing a more uniform polished surface.

This and other advantages will be apparent to those of ordinary skill in the art having reference to the specification in conjunction with the drawings.

DETAILED DESCRIPTION OF THE EMBODIMENTS

The invention will now be described in conjunction with forming shallow trench isolation. It will be apparent to those of ordinary skill in the art having reference to the specification that the benefits of the invention may be applied to other gap fill materials and applications.

Figure 1A:
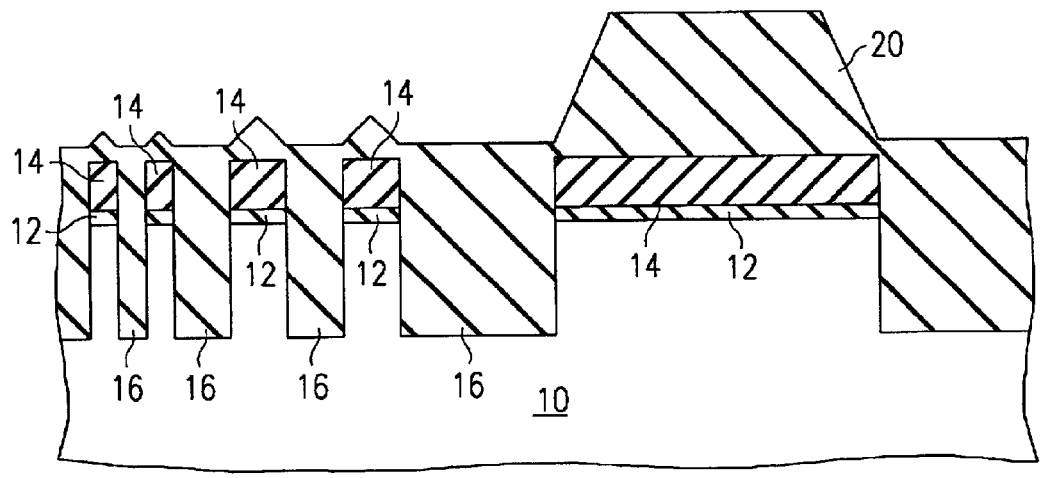
FIGS. 1A & 1B are cross-sectional diagrams of a prior art CMP planarization process.
Figure 1B:
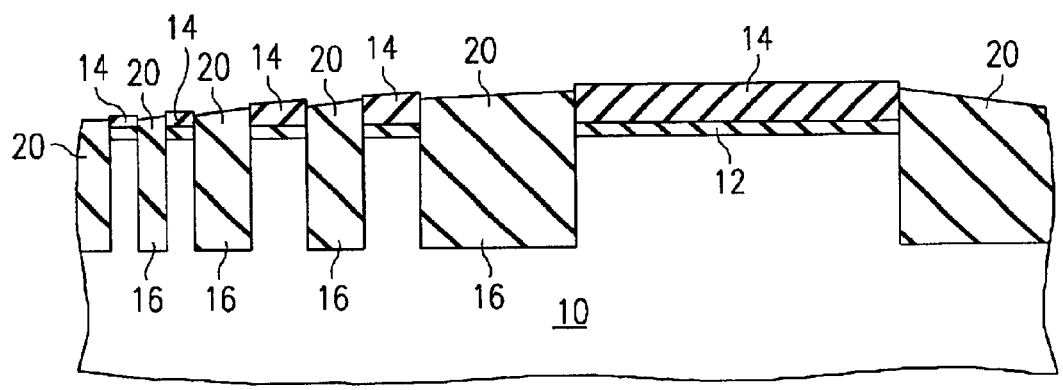
Figure 2:
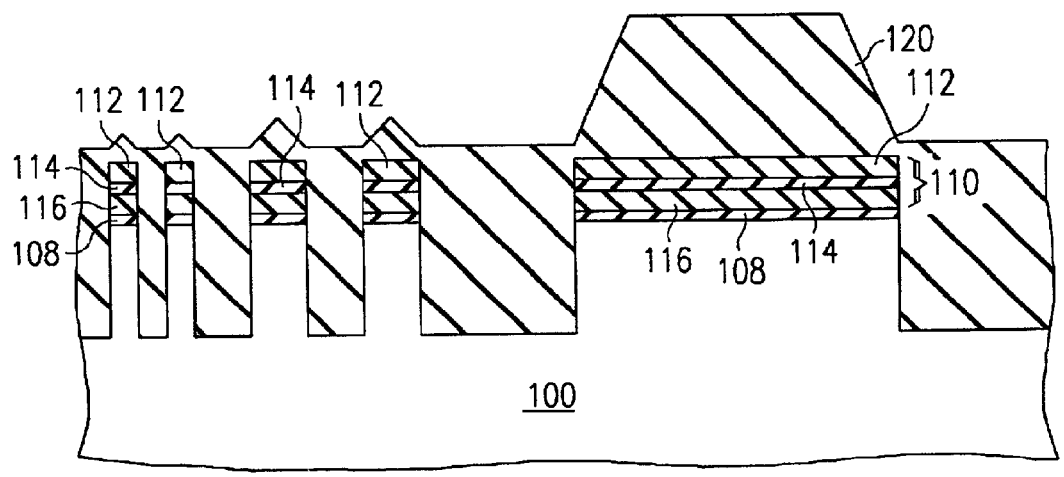
FIG. 2 is a cross-sectional diagram of a CMP polish stop layer according to an embodiment of the invention.

A polish stop 110 according to the invention is shown in FIG. 2. Polish stop 110 comprises at least three layers: film 112/film 114/film 116. Film 112's CMP erosion rate is lower than the CMP erosion rate for the gap fill material 120. The CMP selectivity of film 112 need not be greater than 5, although it can be. Film 114 is highly resistant to the strip etching of film 112. As an example, film 112 may be silicon nitride and film 114 may be silicon dioxide. The silicon nitride of film 114 may be stripped using phosphoric acid without removing the silicon oxide of film 114.

Film 116 may or may not comprise the same material as film 112. However, film 116 also has a CMP erosion rate lower that the CMP erosion rate for the gap fill material 120. In the preferred embodiment, film 112 comprises silicon nitride, film 114 comprises silicon dioxide, and film 116 comprises silicon nitride. The thickness of film 116 sets the maximum step height of the final polished surface of gap fill material 120. However, film 116 must also be thick enough to effectively act as a polish stop for the second CMP step. In the preferred embodiment, the thickness of film 116 is approximately 30 nm.

Figure 3A:
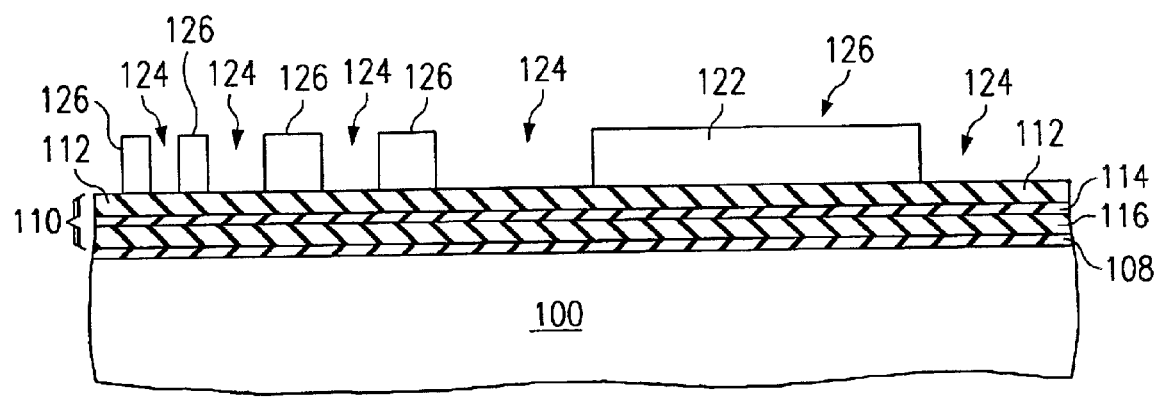
FIGS. 3A–3F are cross-sectional diagrams of a CMP planarization process according to an embodiment of the invention at various stages of fabrication.

A method for practicing an embodiment of the invention will now be discussed with reference to FIGS. 3A–3F. Film 116 of polish stop 110 is deposited over a pad oxide 108 and a semiconductor body 100. As shown in FIG. 3A, semiconductor body 100 comprises a silicon substrate. Epitaxial layers (not shown) may have been formed over the silicon substrate as is known in the art. In addition, impurities may have been implanted for buried well regions, well regions, threshold adjusts, etc prior to depositing film 116.

Film 116 comprises a material that has a lower CMP erosion rate than the subsequently deposited material to be planarized (i.e., gap fill material). The thickness of film 116 is 30–50 nm in the preferred embodiment. Film 116 is thick enough to withstand the second CMP step described below. However, the thickness of film 116 determines the maximum step height of the subsequently planarized surface. In the preferred embodiment, film 116 comprises silicon nitride.

Film 114 is deposited over film 116 and film 112 is deposited over film 114. Film 112 comprises a material that may be etched selectively with respect to film 114. Film 114 is a relatively thin layer. Its thickness is determined by the etch selectivity between films 114 and 112. Film 114 must withstand the complete removal of film 112. An appropriate thickness for film 114 is approximately 10 nm. In the preferred embodiment, film 114 comprises silicon dioxide.

Film 112 comprises a material that has a lower CMP erosion rate than the subsequently deposited material to be planarized (i.e., gap fill material). The thickness of film 116 is chosen such that film 112 will withstand the first CMP step described below. A portion of film 112 is typically removed during the first CMP step. An appropriate thickness for film 112 is approximately 100 nm. In the preferred embodiment, film 116 comprises silicon nitride.

Next, a photoresist pattern 122 is formed over film 112. For STI, pattern 122 exposes the isolation areas 124 of the semiconductor body 100 and covers the active areas 124. The active areas 124 will typically have transistors or other devices formed therein.

Figure 3B:
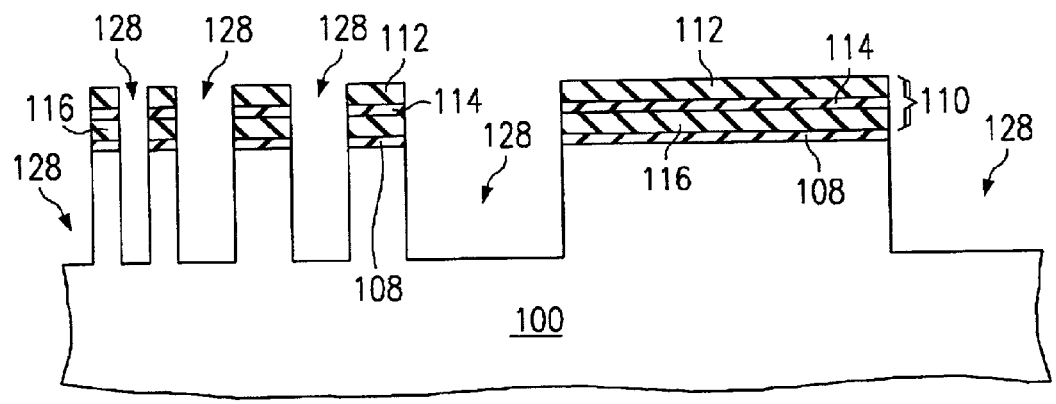

Stop layer 110 is then etched using pattern 122 as a mask. Stop layer 110 forms a hard mask for etching isolation trenches 128 in semiconductor body 100. Pattern 112 is removed. Typical trench depths are in the range of 300–500 nm. The resulting structure is shown in FIG. 3B.

Figure 3C:
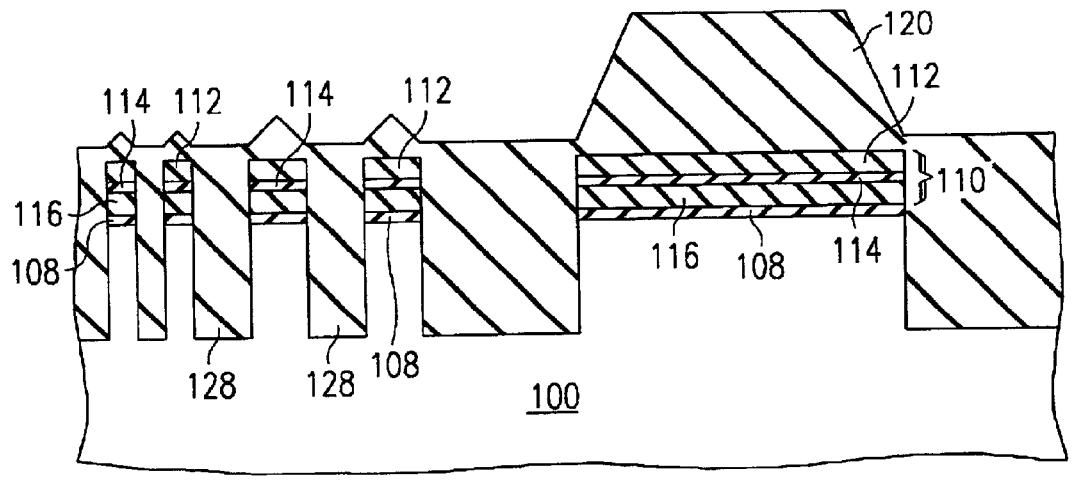

Referring to FIG. 3C, a gap fill material 120 is deposited in trenches 128. In the preferred embodiment, gap fill material 120 comprises HDP (high density plasma) silicon dioxide. However, other CVD (chemical vapor deposition) materials, such as PECVD (plasma enhanced CVD) oxides, may alternatively be used. If desired, a liner oxide may be deposited prior to depositing gap fill material 120.

Figure 3D:
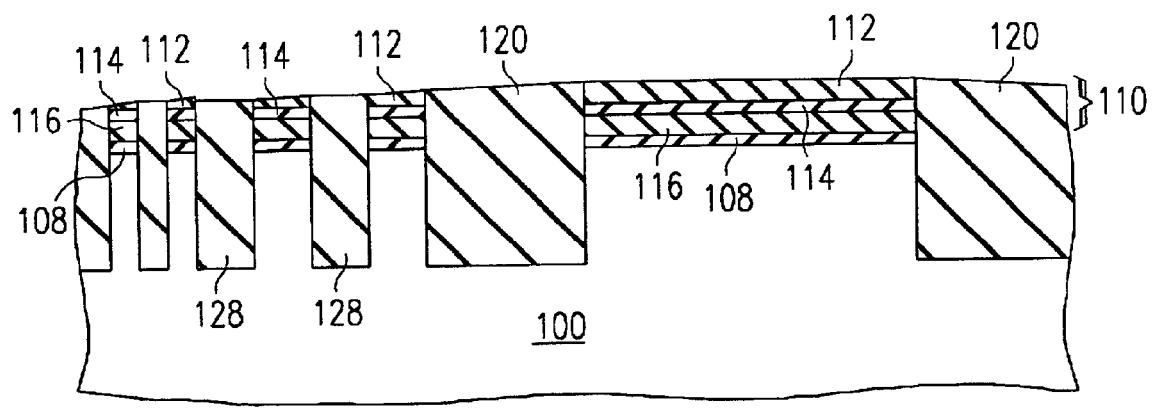

In order to ensure that all gaps (trenches 128) are completely filled, excess material is deposited in some areas. A typical range for the deposition thickness of gap fill material 120 is in the range of 700–1000 nm. This excess material needs to be removed in order to planarize the structure. CMP is used to planarize the structure. Gap fill material 120 is chemically mechanically polished until film 112 is completely exposed. By continuing CMP until film 112 is completely exposed, some of film 112 is eroded, as shown in FIG. 3D. The material and thickness of film 112 is chosen such that film 112 is not completely eroded at any point. At this point, the dishing of gap fill material 120 is determined according to the pattern density of the active areas 126.

Figure 3E:
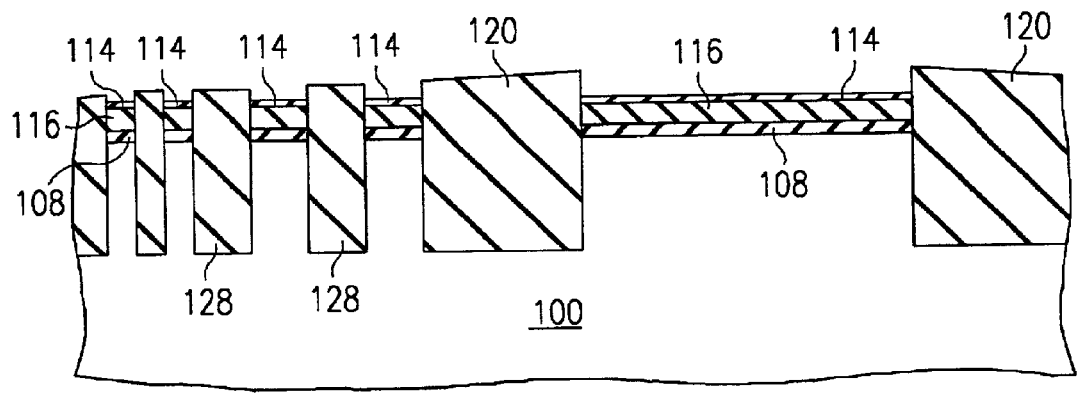

Referring to FIG. 3E, film 112 is stripped using an etch that is selective against (i.e., removes significantly less of) the material of film 114. The etch is stopped on film 114. For the example of silicon nitride for film 112 and silicon dioxide for film 114, a phosphoric acid chemistry may be used to strip film 112. The strip etch can be accomplished using a highly selective down stream or non-RIE plasma etcher. The pattern density of the remaining gap fill material 120 is now the reverse of the pattern density prior to the first CMP step.

Figure 3F:
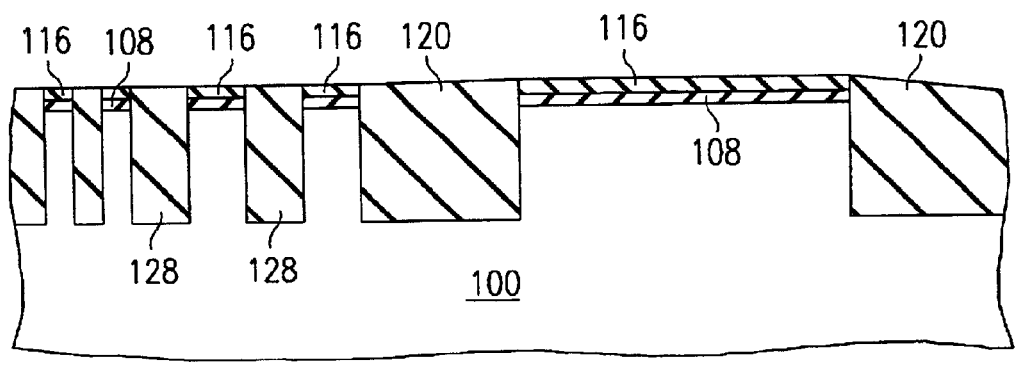

A second CMP polish is then performed as shown in FIG. 3F. The second CMP stops of film 116. The material and thickness of film 116 is chosen such that film 116 is not completely eroded at any point. The dishing of the second CMP cancels the dishing of the first CMP making the final polished surface 130 flat. The maximum step height of the polished surface across the wafer is less than the thickness of the film 116. For example, the maximum step height may be in the range of 30–40 nm.

The ratio of the thickness of film 112 and film 116 can be varied to optimize the product chip. For extreme ranges of pattern densities, additional films 112 can be used with intervening films 114.

Processing then continues with the removal of film 116, the formation of transistors and the like, and the formation of interconnect layers, and packaging.

Figure 4A:
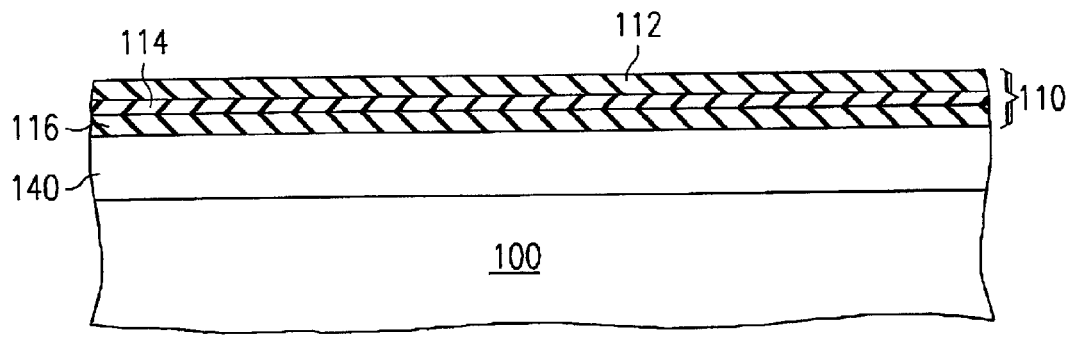
FIGS. 4A–4D are cross-section diagrams of a CMP planarization process according to an embodiment of the invention applied to interlevel dielectric planarization.
Figure 4B:
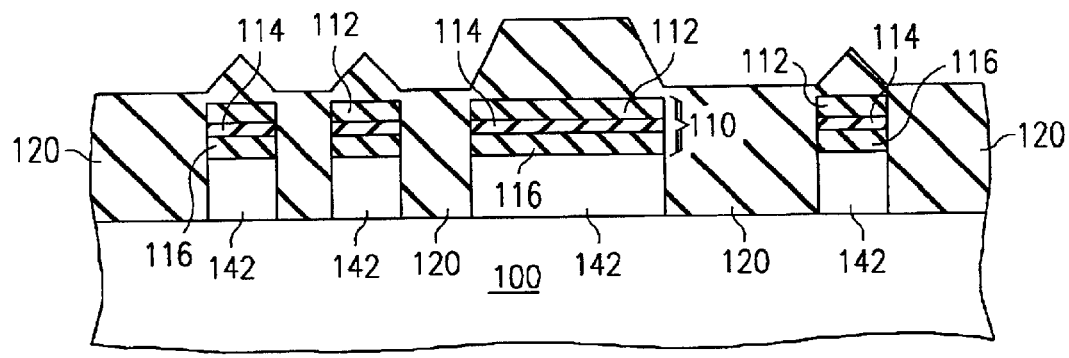
Figure 4C:
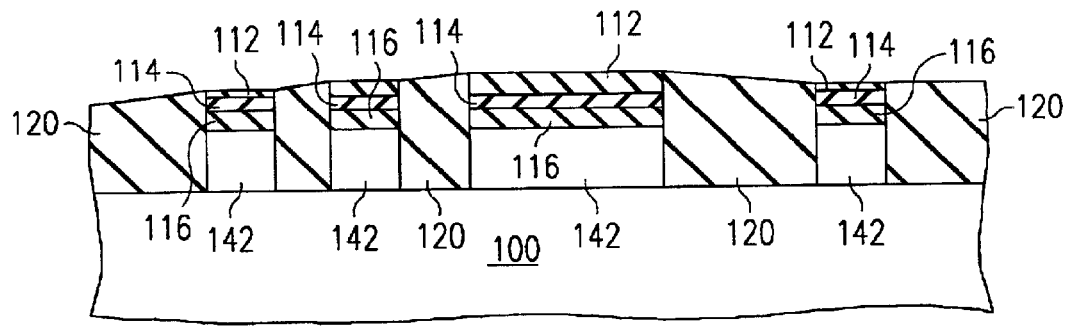
Figure 4D:
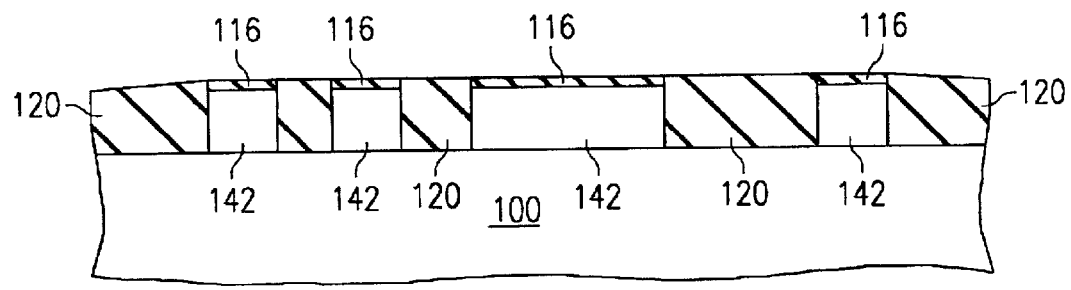

While the invention is described above in relation to STI, it will be apparent to those of ordinary skill in the art having reference to the specification that the invention may be applied to other gap fill applications. For example, the invention may be applied to interlevel dielectrics of metal interconnects. In this case, the polish stop layer 110 is deposited over a metal layer 140, as shown in FIG. 4A. As in the prior embodiment, polish stop layer comprises film 112, film 114, and film 116. The metal layer may comprise aluminum with appropriate barrier layers. An interconnect pattern (not shown) is formed. The polish stop layer 110 is etched using the interconnect pattern. The polish stop layer 110 then acts as a hard mask for the metal etch. The metal etch is used to form metal leads 142, as shown in FIG. 4B. Gap fill material 120 is used as an interlevel dielectric to fill the spaces between metal leads 142. Gap fill material 120 is then planarized using the process described above. Gap fill material 120 is CMP'd with film 112 acting as the polish stop, as shown in FIG. 4C. Then, film 112 is stripped and a second CMP step is the accomplished stopping on film 116. As a result, the planarized surface of gap fill material 120 has a significantly smaller step height than prior art approaches, as indicated in FIG. 4D.

An example is planarizing a metal level oxide (MLO) in a DRAM prior to self-aligned contact. The polish stop layer 110 of the invention is used as a hard mask for the wordline stack etch. After the wordline stack is etched, the MLO is deposited in the gaps between wordlines. The MLO may be planarized using the process described above.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A chemical-mechanical polishing process comprising the steps of:

chemically mechanically polishing a gap fill material stopping on a first film;

stripping the first film to expose a second film;

after exposing the second film, chemically mechanically polishing the gap fill material and the second film stopping on a third film.

2. The method of claim 1, wherein said first and third film comprise the same material.

3. The method of claim 1, wherein said first film and said third film comprise silicon nitride.

4. The method of claim 3, wherein the second film comprises silicon dioxide.

5. The method of claim 1, wherein the third film has a thickness in the range of 30–50 nm.

6. The method of claim 1, wherein said gap fill material forms a shallow trench isolation structure.

* * * * *